United States Patent
Huang et al.

(10) Patent No.: US 10,410,900 B2
(45) Date of Patent: Sep. 10, 2019

(54) PRECISION SCREEN PRINTING WITH SUB-MICRON UNIFORMITY OF METALLIZATION MATERIALS ON GREEN SHEET CERAMIC

(71) Applicant: APPLIED MATERIALS, INC., Santa Clara, CA (US)

(72) Inventors: Shih-Ying Huang, San Jose, CA (US); Steven E. Babayan, Los Altos, CA (US); Phillip Criminale, Livermore, CA (US); Stephen Prouty, San Jose, CA (US); Anthony Huang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/667,281

(22) Filed: Aug. 2, 2017

(65) Prior Publication Data
US 2018/0040498 A1 Feb. 8, 2018

Related U.S. Application Data

(60) Provisional application No. 62/371,636, filed on Aug. 5, 2016.

(51) Int. Cl.
*H05K 3/12* (2006.01)
*B41F 15/42* (2006.01)
(Continued)

(52) U.S. Cl.
CPC ........ *H01L 21/6833* (2013.01); *B41F 15/423* (2013.01); *H01L 21/67103* (2013.01);
(Continued)

(58) Field of Classification Search
CPC . H01L 21/6833; H01L 21/6831; H02N 13/00; H01J 37/32715; H01J 37/32697; B41F 15/42; B41F 15/426
See application file for complete search history.

(56) References Cited

U.S. PATENT DOCUMENTS

| | | | | |
|---|---|---|---|---|
| 5,479,854 | A | * | 1/1996 | Chikahisa ............. B41F 15/423 101/123 |
| 5,886,863 | A | * | 3/1999 | Nagasaki ............ H01L 21/6831 279/128 |

(Continued)

FOREIGN PATENT DOCUMENTS

| | | |
|---|---|---|
| JP | 2003-282351 | 10/2003 |
| JP | 2004349666 A | 12/2004 |
| WO | 2012019017 A2 | 2/2012 |

OTHER PUBLICATIONS

International Search Report and Written Opinion from PCT/US2017/045637 dated Nov. 13, 2017, 16 pgs.

(Continued)

*Primary Examiner* — Jose Hernandez-Diaz
(74) *Attorney, Agent, or Firm* — Schwabe, Williamson & Wyatt, P.C.

(57) ABSTRACT

Precision screen printing is described that is capable of sub-micron uniformity of the metallization materials that are printed on green sheet ceramic. In some examples, puck is formed with electrical traces by screen printing a paste that contains metal on a ceramic green sheet in a pattern of electrical traces and processing the printed green sheet to form a puck of a workpiece carrier. In some example, the printing includes applying a squeegee of a screen printer to the printed green sheet in a squeegeeing direction while the green sheet is on a printer bed of the screen printer. The method further includes mapping the printer bed at multiple locations along the squeegeeing direction, identifying non- (Continued)

uniformities in the printer bed mapping, and modifying a printer controller of the screen printer to compensate for mapped non-uniformities in the printer bed.

7 Claims, 12 Drawing Sheets

(51) Int. Cl.
*H01L 21/683* (2006.01)
*H01L 21/687* (2006.01)
*H01L 21/67* (2006.01)
*H05B 3/28* (2006.01)
*H05K 1/02* (2006.01)
*H05K 1/16* (2006.01)
*H05K 1/18* (2006.01)
*H05K 3/00* (2006.01)
*H05K 1/03* (2006.01)

(52) U.S. Cl.
CPC .... *H01L 21/6831* (2013.01); *H01L 21/68785* (2013.01); *H05B 3/283* (2013.01); *H05K 1/0201* (2013.01); *H05K 1/0212* (2013.01); *H05K 1/165* (2013.01); *H05K 1/167* (2013.01); *H05K 1/181* (2013.01); *H05K 3/0097* (2013.01); *H05K 3/1233* (2013.01); *H05K 3/1291* (2013.01); *B41P 2200/40* (2013.01); *H05B 2203/017* (2013.01); *H05K 1/0306* (2013.01); *H05K 2203/0139* (2013.01); *H05K 2203/162* (2013.01); *H05K 2203/163* (2013.01); *H05K 2203/166* (2013.01)

(56) References Cited

U.S. PATENT DOCUMENTS

| 5,893,325 | A | * | 4/1999 | Sakai | B41F 15/423 |
| | | | | | 101/123 |
| 9,019,684 | B2 | | 4/2015 | Kuribayashi | |
| 2008/0083816 | A1 | * | 4/2008 | Leinbach | B23K 3/0638 |
| | | | | | 228/102 |
| 2014/0159325 | A1 | | 6/2014 | Parkhe et al. | |
| 2014/0355170 | A1 | | 12/2014 | Wada et al. | |
| 2015/0022936 | A1 | | 1/2015 | Cox et al. | |

OTHER PUBLICATIONS

Zongrong Liu, et al., "Development of Glass-Free Metal Electrically Conductive Thick Films," Mar. 2001, pp. 64-69, vol. 123, Journal of Electronic Packaging, Transactions of the ASME.

Mark Eblen, "Thermal Conductivity of Thick Film Tungsten Metallization used in High-Alumina Ceramic Microelectronic Packages," 15 pages.

* cited by examiner

INK THICKNESS TRENDING OVER PRINTING

| SCREEN MASK DESIGN | | | ENCODER DOE | | |
|---|---|---|---|---|---|
| MASK DESIGN | SQUEEGEE GAP | MIN TRIAL PRINTING | ENCODER DOE | ENCODER SETTING | MIN TRIAL PRINTING |
| MASK A | g0 | 3 | | | |
| | | | g2 | 20% higher than g0 | 2 |
| | | | g1 | 10% higher than g0 | 2 |
| MASK B | g0 | 3 | g0 | BASELINE | |
| | | | g3 | 10% lower than g0 | 2 |
| | | | g4 | 20% lower than g0 | 2 |
| MASK C | g0 | 3 | | | |

…
PRECISION SCREEN PRINTING WITH SUB-MICRON UNIFORMITY OF METALLIZATION MATERIALS ON GREEN SHEET CERAMIC

FIELD

The present description relates to the field of carriers for workpieces that are made into microelectronic and micromechanical devices and, in particular, to forming such carriers using screen printing on green sheet ceramic.

BACKGROUND

In the manufacture of semiconductor chips, a workpiece, such as a silicon wafer or other substrate is exposed to a variety of different processes in different processing chambers. The chambers may expose the wafer to a number of different chemical and physical processes whereby minute integrated circuits and micromechanical structures are created on the substrate. Layers of materials which make up the integrated circuit are created by processes including chemical vapor deposition, physical vapor deposition, epitaxial growth, and the like. Some of the layers of material are patterned using photoresist masks and wet or dry etching techniques. The substrates may be silicon, gallium arsenide, indium phosphide, glass, or other appropriate materials.

The processing chambers used in these processes typically include a substrate support, pedestal, or chuck to support the substrate during processing. In some processes, the pedestal may include an embedded heater to control the temperature of the substrate and, in some cases, to provide elevated temperatures that may be used in the process. An electrostatic chuck (ESC) has one or more embedded conductive electrodes to generate an electric field that holds the wafer on the chuck using static electricity.

An ESC will have a top plate, referred to as a puck, a bottom plate or base, referred to as a pedestal, and an interface or bond to hold the two together. The top surface of the puck has a contact surface that holds the workpiece which can be made of various materials, e.g. polymers, ceramic, or a combination, and may have coatings all over or over selective locations, etc. A variety of components are embedded into the puck including electrical components for holding or chucking the wafer, and thermal components for heating the wafer.

Because the circuits and structures formed on the workpiece are very small, the thermal and electrical environment provided by the workpiece support must be very precise. When the temperature is not uniform or consistent across the workpiece, the circuits and structures will have variations. If one support is different from another support, then the circuits and structures will vary with different supports. For extreme cases, the processes may require adjustment for use with different supports. This directly affects the quality and yield of the circuits and structures produced on the workpieces. As a result, a puck with embedded, thermal and electrical components has stringent dimensional requirements, both in-plane and vertical, to ensure consistent performance not only across the surface of a particular ESC but also from one ESC to another ESC.

SUMMARY

Precision screen printing is described that is capable of sub-micron uniformity of the metallization materials that are printed on green sheet ceramic. In some examples, puck is formed with electrical traces by screen printing a paste that contains metal on a ceramic green sheet in a pattern of electrical traces and processing the printed green sheet to form a puck of a workpiece carrier. In some example, the printing includes applying a squeegee of a screen printer to the printed green sheet in a squeegeeing direction while the green sheet is on a printer bed of the screen printer. The method further includes mapping the printer bed at multiple locations along the squeegeeing direction, identifying non-uniformities in the printer bed mapping, and modifying a printer controller of the screen printer to compensate for mapped non-uniformities in the printer bed.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As described herein, a top plate can be made for a chuck, pedestal, or carrier that supports a workpiece, for example a silicon or other wafer, in a carrier. The top plate may be formed of ceramic with embedded electrical components and provide very high accuracy in the shape and the size of the embedded components. This provides better control over process parameters on the workpiece. The components are also more consistent from top plate to top plate. This provides more consistent production results as the top plates wear out and are replaced. As a result, smaller and more accurate features may be formed on the workpiece with higher quality and uniformity, reducing cost, increasing production quantities, and reducing down time for adjusting production parameters.

A method for screen printing with sub-micron uniformity is disclosed herein. This method is suitable for screen printing of some materials that require precision print thickness and uniformity over screen mask patterns. An illustrated application is the printing of metallization material on green sheet ceramic that is a core process for making uniform heater trace patterns used in an electrostatic chucking (ESC) apparatus. The ESC is of special importance to semiconductor processing for chip device performance and wafer yield.

An ESC with very high temperature uniformity benefits from very high uniform printing of metallization materials, on green sheet ceramic. Materials that are printed onto a surface including any that have metallization materials will be referred to below simply as ink. In examples herein, an ESC puck is made of multiple green sheets, and some of them are ink printed with heater trace and electrostatic electrode patterns. The print uniformity may be at a sub-micron level.

Figure 1:
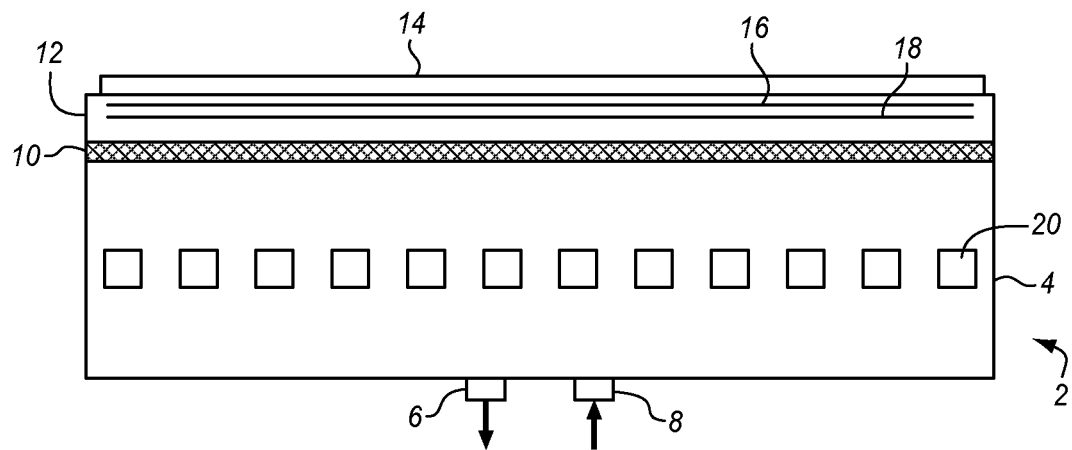
FIG. 1 is a cross-sectional side view diagram of an electrostatic chucking (ESC) apparatus structure according to an embodiment.

FIG. 1 is a cross-sectional side view diagram of an electrostatic chucking (ESC) apparatus structure. The ESC 2 has a cooling base 4 made of a thermally conductive material, such as aluminum or an alloy. There is an input port 6 and an output port 8 coupled to an external thermal fluid pump and heat exchanger. Within the cooling base, the ports are coupled to internal cooling channels 20 that circulate the thermal fluid through the base to help control the temperature of the ESC. A ceramic puck 12 is attached to the cooling base 4 with a thermally conductive bond layer 10. The bond layer is typically a type of adhesive but other materials may be used instead. A workpiece 14 such as a silicon wafer, glass sheet, gallium arsenide wafer or other workpiece is held in place on the puck 12 by an electrostatic charge.

The electrostatic charge is generated and held by chucking electrodes 16 within the puck. The electrodes may be charged or discharged using contacts (not shown) on the side or bottom of the puck. Heater traces 18 may also be formed within the puck to heat the workpiece using resistive heating from the conductive traces, for example. Multiple traces may be used to apply different amounts of heat by different traces to more precisely control the temperature of the puck and thereby the wafer.

The ceramic puck may be formed of multiple green sheets that are ink printed, laminated, machined, sintered, polished, and have surface features that are created in a series of complex processes. Interconnects for both heater traces and the electrode in the puck are not shown. The quality of the heater trace 18 patterns affects the ESC temperature uniformity performance.

A ceramic green sheet may be formed in any of a variety of different ways. In some embodiments, 90-96% ceramic powder, e.g. of $Al_2O_3$ or AlN and glass, is compacted with a binder, e.g. plasticizers, at high pressure and then briefly sintered to form a pliable material that may be handled at room temperature and then hardened later by sintering. The green sheets may be in any of a variety of different thicknesses. As example, the green sheets may be from 0.05 mm to 0.5 mm thick and carried in a stainless steel frame for handling purposes.

Alternatively a green body or any other pliable ceramic material may be used. A green body in some examples is a monolithic compacted block of ceramic power and binder with other fillers. After forming as described below it may be sintered in a furnace under heat and pressure. Such a process may also be applied to the green sheets as mentioned below.

As described herein heater trace patterns and other structures may be formed by printing a paste onto a green sheet. The green sheet may be stacked with other green sheets so that the paste is embedded between green sheets. Different pastes may be dispensed into different patterns to form different types of electrical components. The paste is used to form embedded or surface conductive components. The paste contains a suitable conductive material such as a metal like tungsten, molybdenum, zinc, silver, gold, or a suitable refractory material in a powder, for example, and carried in a suitable suspension and dispersant. The paste is dried, sintered, or cured with the stacked green sheets to form a finished puck.

The stacked green sheets are pressed together with sufficient pressure to form a single, stable structure. The paste is dried to be hard enough to undergo the stacking and the compaction without too much deformation. The lamination of individual ceramic green sheets with the desired thermal and electrical components is then sintered to consolidate the separate sheets into a single solid entity. This is later converted to the final top plate or puck using additional finishing processes such as machining, grinding, polishing, grit blasting, cleaning, etc. Because metal or refractory materials may be dispensed on to intermediate sheets, these features can be embedded within the resulting structure after the sheets are pressed together.

For repeatable and consistent quality of ESCs in a production lot, or from various lots, the described method first identifies some hidden printer hardware's skews for eliminating or minimizing later hard-to-identify root causes for systematic print skew.

Figure 2:
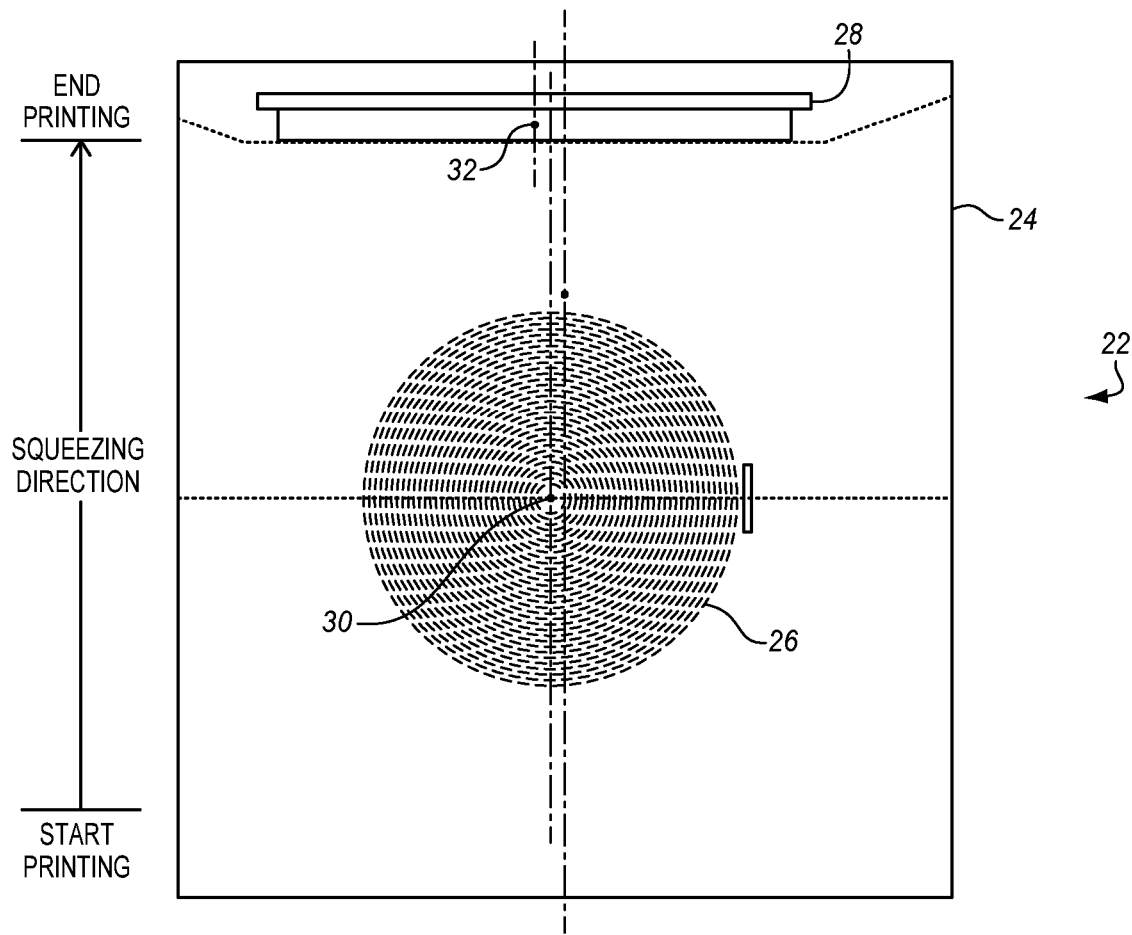
FIG. 2 is a top view diagram of a printer set-up for symmetric ink printing (SIP) according to an embodiment.

FIG. 2 is a diagram of a printer set-up for symmetric ink printing (SIP) to show the direction of different possible skews. The printer 22 includes a printing table 24 that carries the green sheet 26 that is to be printed. The printer swipes the workpiece with a squeegee 28 that runs across the workpiece.

Major set up skews are first recognized and minimized. The centers of both screen mask and squeegee may be aligned with the center of the heater trace patterns. In particular, a symmetric alignment between a heater trace pattern center, screen mask center and squeegee center are mandated with a tight tolerance. The centers of heater trace patterns are typically located on the center 30 of the screen mask. On the printer, the screen mask is positioned over the workpiece 26. Ink is pushed through the screen by the squeegee to form an ink pattern on the workpiece as the squeegee is drawn across the screen. This is shown as starting at a start position and ending at the end position at which the squeegee is shown as resting in the diagram. The printed pattern squeezed through the screen mask is the pattern of heater and other electrical traces on the workpiece.

The center of a mounted squeegee 32 may also be aligned with the center of the screen's heater trace patterns 30. Any hidden or ignored hardware skews can cause a printing skew. Such a skew could make a heater trace design ineffective. This printer hardware alignment tenet is then used for a method referred to herein as Symmetric Ink Printing (SIP) of metallization materials.

Figure 3:
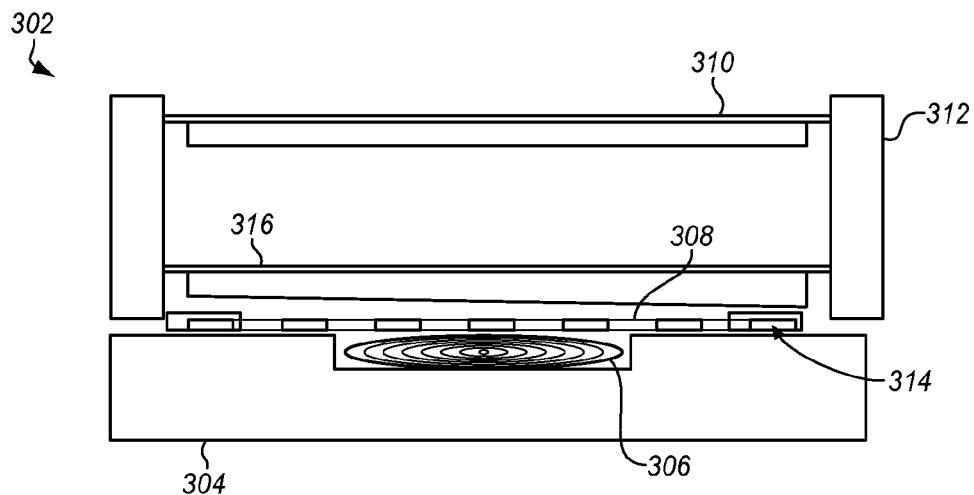
FIG. 3 is a side cross-sectional view diagram of a traditional squeegee set up for SIP.

Traditional printing methods use some shimming devices for setting up the squeegee for each production order. FIG. 3 is a diagram of a traditional squeegee set up. A setup method has been used to add different types of shimming devices. The printer 302 has a printing bed 304 and a sample, test, or trial workpiece 306 is placed on the bed. A mask 308 is placed over the workpiece. The squeegee 310 is mounted on brackets or rails 312 and then trials are conducted. Shimming devices 314 are added to the rails to compensate for any lack of parallelism. After this process, the squeegee is in a new more accurate position 316.

Unfortunately, the actual printed ink thickness and its uniformity cannot be known at the time of set up. Operators repeat the complete set up process if trial printing outcomes are not satisfactory. The desired squeegee gap should enable conformal printing that leads to high uniform ink thickness over all of the heater trace patterns.

Both the squeegee gap and parallelism to the printer bed are only approximated with the use of shimming devices, but the printed ink thickness and its uniformity are actually not known at that time. The printer setup conditions may also drift away after the queue time for measuring printed ink for a trial. Therefore, the traditional printing method is not capable of producing print uniformity at a sub-micron level.

Therefore, the repeatability of squeegee mounting on its holder may be important. Dedicated brackets or alignment fixtures for squeegee mounting may be used for ensuring high mounting repeatability from lot to lot production as shown in FIG. 4.

Figure 4:
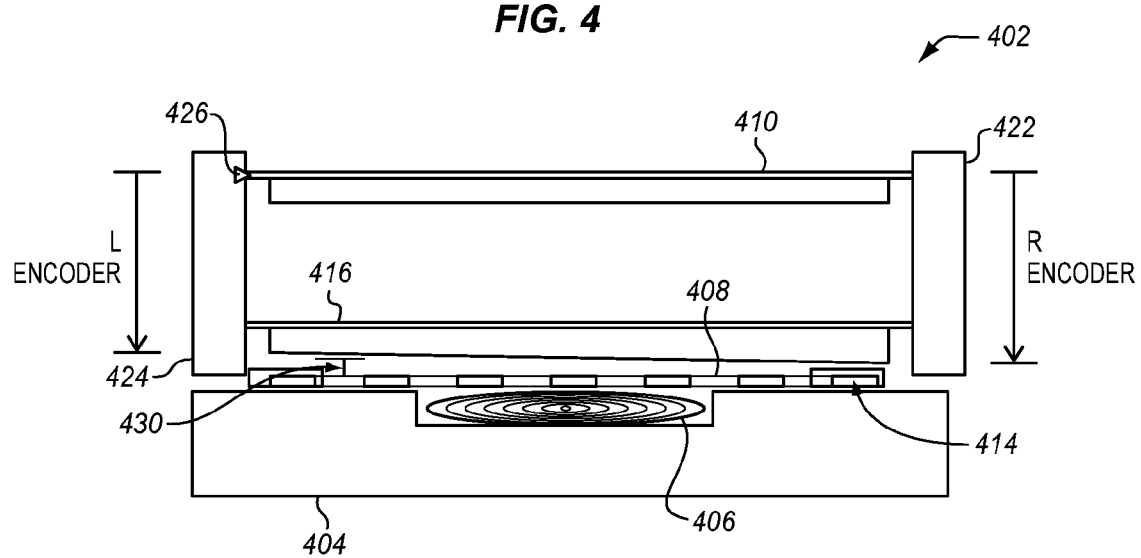
FIG. 4 is a side cross-sectional view diagram of an adjustable printer according to an embodiment.

FIG. 4 is a side cross-sectional diagram of an adjustable printer. The printer 402 has a printer bed 404 that carries a workpiece 406. A print screen 408 is fastened to the printer bed over the workpiece 406. The print screen may or may not be fitted with shims 414 on one or both sides as in FIG. 3, depending on the implementation. Squeegee brackets 422, 424 are mounted one on each side of the squeegee 410 to hold it in position as it swipes over the print screen 408 from its initial start position 410 to its finished position 416.

The right side bracket 422 is the same as in FIG. 3, but the left side bracket 424 has been adjusted with a shim 426 at the squeegee mount. This shim allows the system to compensate for any misalignment between the two brackets. As shown there is a larger gap 430 on the left side than on the right. The bracket shim can compensate for this while the screen shims 414 may compensate for any misalignment with the screen and the workpiece. Optionally either or both types of shims may be removed as unnecessary.

The encoder from a motorized actuator may be used to precisely control the squeegee gap at the resolution of the encoder. The squeegee mounting brackets may be very useful with this approach. The squeegee slant may be compensated with the printer's 'auto-zero' feature or with an alternative means.

Precision Screen Printing with Motorized Actuator

Figure 5:
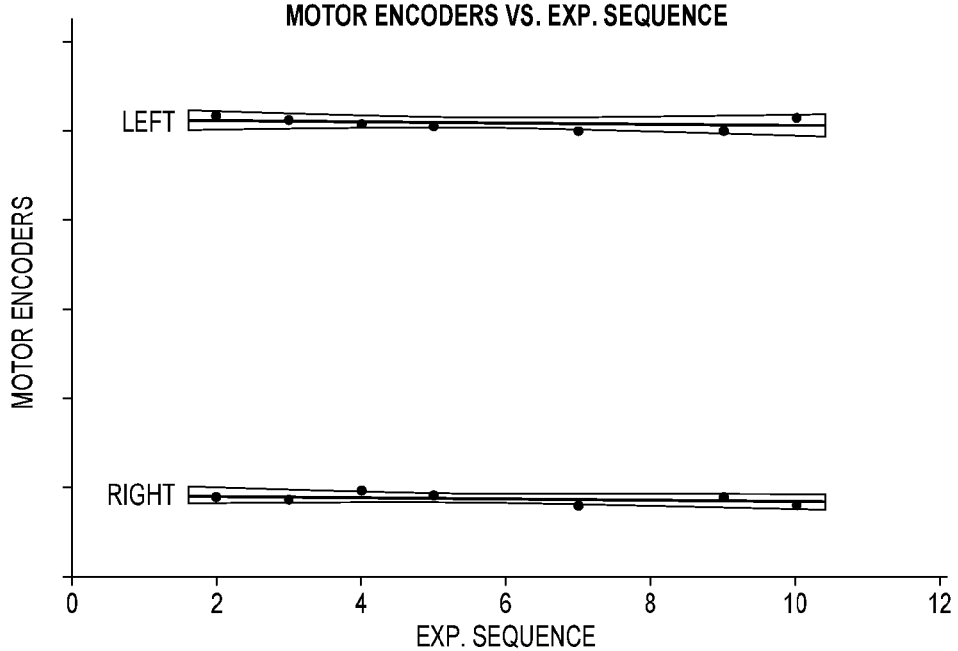
FIG. 5 is a graph of motor encoder transducer feedback against exposure sequence according to an embodiment.

Some embodiments use a method with a motorized actuator (linear or rotary) with an encoder, one on each end of the squeegee mount, that is typically integral, or can be added, to the printer system. A motor encoder may be available from the printer controller. The motorized actuator precisely controls the squeegee gap and compensates for its unparallelism at resolutions of a single motor encoder (e.g. a step count). Further, some printers have a built-in auto-zero feature with some sorts of transducer feedback, as shown in FIG. 5, so that the required encoder compensation can be easily obtained. With the use of dedicated squeegee mounting brackets, the printer squeegee set up can achieve high repeatability from lot to lot.

FIG. 5 is a diagram of motor encoder transducer feedback on the vertical axis against exposure sequence on the horizontal axis. The data has points only for each exposure numbered 2 through 10 in this example, and a straight line is drawn through the data points to show whether this is an overall increasing or decreasing trend. In this example data, there is no significant trend through the sequence of exposures.

The squeegee set up is highly repeatable with the use of brackets. In this example, the squeegee set up is much more repeatable than with the traditional shimming method. Unparallelism, due to any of a variety of different reasons, can be compensated by the printer's auto-zero feature, which in this example is estimated to be close to 1 mm.

With the above described SIP printer set up method that uses a motor encoder as a control, the printed heater traces have high repeatability of the printed ink on green sheet ceramic. After sintering, a metallization process of printed ink, the resultant heater trace patterns are able to produce an ESC puck of high temperature uniformity with lot-to-lot repeatability.

Precision printing of a desired ink thickness, on the other hand, may be achieved with a knowledge-based model that is established with a lean DOE (Design of Experiment) plan to cover regions of interest. For a given screen mask design, a high resolution one-on-one relationship between heater trace resistivity to printed ink thickness can be thus derived in a DOE plan.

Figure 6:
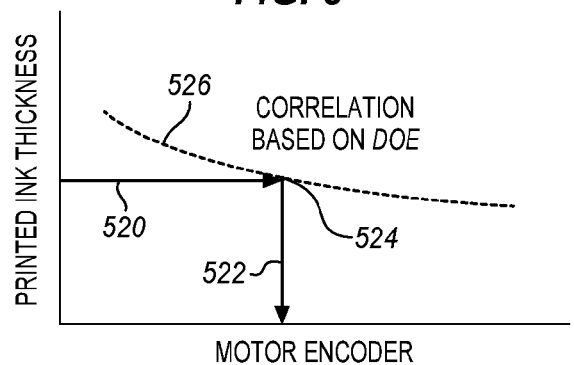
FIG. 6 is a graph of printed ink thickness against the motorized encoder according to an embodiment.

FIG. 6 is a diagram of a graph of printed ink thickness on the vertical axis against the motorized encoder in steps on the horizontal axis. The ink thickness 520 amount and the motor encoder value or steps value 522 meet at a point 524 on the graph. A correlation curve 526 may then be drawn through the points to determine the correlation based on the DOE. A high resolution one-on-one relationship between printed ink thicknesses to squeegee motor encoder steps can thereby be derived in the same DOE experiment. Once a knowledge-based model is developed, an operator may set up the printer squeegee and print by referencing the model.

In a similar way, a DOE plan may be carried out to obtain highly repeatable correlation covering a design specification window of heater trace resistivity. For a targeted heater trace resistivity, the operator looks in the DOE model for the corresponding motor encoders and then prints the green sheets.

Figure 7:
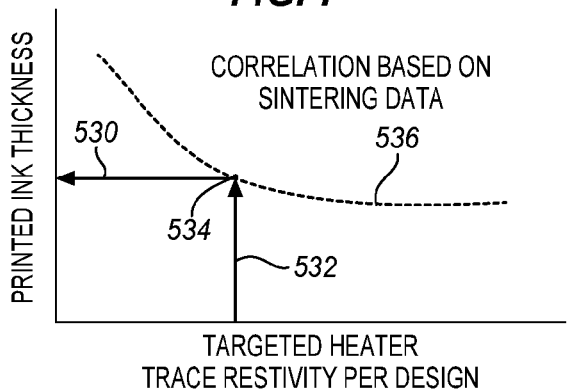
FIG. 7 is a graph of printed ink thickness against targeted heater trace resistivity per a design according to an embodiment.

FIG. 7 is a diagram of a graph of printed ink thickness on the vertical axis against the targeted heater trace resistivity per the design. A particular ink thickness 530 intersects with a particular heater trace resistivity 532 based on empirical values at an intersection 534 on the graph. Multiple experimental data points may then be used to build a correlation curve 536. This curve like the thickness/encoder correlation curve may be used to set the parameters for a particular trace printing task.

The described method may be implemented in many different ways in ESC ceramic puck manufacturing. Metallization materials referred to in this method may be of any refractory-based metal that is formulated in liquid form or ink. The green sheet ceramic referred to in this method may be of alumina based or aluminum nitride based ceramic, regardless of their purity level or additive formulation materials. This method can be used for printing of non-metallization material where precise and high uniform thickness of materials is desired. The motorized actuator may be linear or rotary. Any encoder information from the motorized actuator may be used to represent the control limit of squeeze set up.

Traditional metallization materials printing on green sheet ceramic may have the following disadvantages:

1) Inaccurate and non-repeatable print thickness: Current traditional printer squeegee set up methods employ some types of shimming devices. This type of set up process relies on the operator's experience, and results are not repeatable for ESC applications. The thickness of printed metallization materials is only known by guessing at the time of trial printing. Lot-to-lot set up suffers low repeatability.

2) Time-consuming: Trial printing of metallization materials is necessary for the shimming method. Printed ink takes a lengthy queue time to ink stabilization before a thickness measurement can take place.

3) Drifting of squeegee set up after trial printing: residual ink materials left on the screen mask will dry up during measurement queue time. Screen mask cleaning has impacts on subsequent printing. Print results often drift when production sets in.

4) Cumbersome production scheduling: Operators need to re-do squeegee set up if the trial run results are way off from the manufacturing specification. Such re-do uncertainty impacts manufacturing scheduling in a complicated manufacturing environment.

5) Compromised quality: Manufacturing engineering tends to accept sub-par quality because of the cumbersome squeegee set-up process.

Implementation of SIP Printing Method

SIP printing methods with metallization materials on green sheet ceramics may be directly applied to an Electrostatic Chucking (ESC) Apparatus. The printing methods may be applied to an ESC that has single or multiple main heaters in the ESC puck for semiconductor wafer processing applications. The printing methods may be applied to an ESC that has a symmetric or un-symmetric layout of mini heaters in the ESC puck. These mini heaters are used for versatile thermal control. The printing methods may be applied to metallization materials on green sheet ceramics for non-ESC applications where high printing uniformity on green sheet ceramic is desired.

Figure 8:
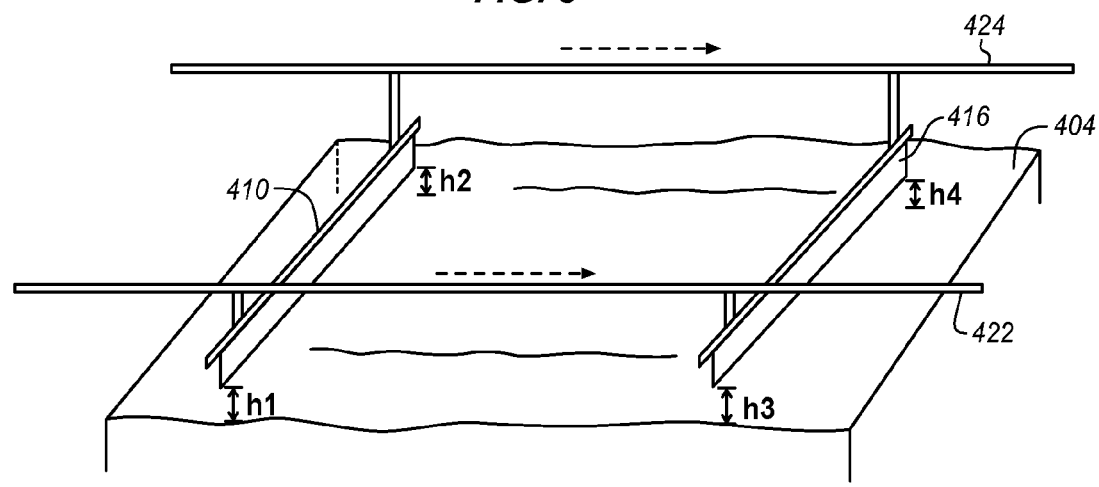
FIG. 8 is an isometric diagram of a printer and squeegee rails to show adjustment points according to an embodiment.

FIG. 8 is an isometric diagram of a printer and squeegee rails to show adjustment points. The printer bed 404 has a right 422 and left 424 squeegee rail mounted to it. The squeegee runs from a start position 410 to a finish position 416 across a print screen. Both printer bed flatness and the lack of precise parallelism of the squeegee rails impact the consistency of the ink printing. Squeegee gaps (h1, h2, h3, h4) are indicated on the right and left sides of the squeegee at each rail and at the two positions 410, 416. The gaps are not the same if the printer bed is not perfectly flat. In addition, the gaps will not be the same for each measurement if the squeegee mounting is not consistent.

A method may be applied to aid with precision screen printing that is capable of sub-micron uniformity of the metallization materials on the green sheet ceramic. First the screen mask and the squeegee are set up to be aligned with the heater trace center. Then the squeegee gap and parallelism to the printer bed are optimized using the printer's auto-zero feature. The auto-zero feature results are recorded with motor encoders. As an example at a center location the motor encoder might be set at Left=25000, Right=25850.

Figure 9:
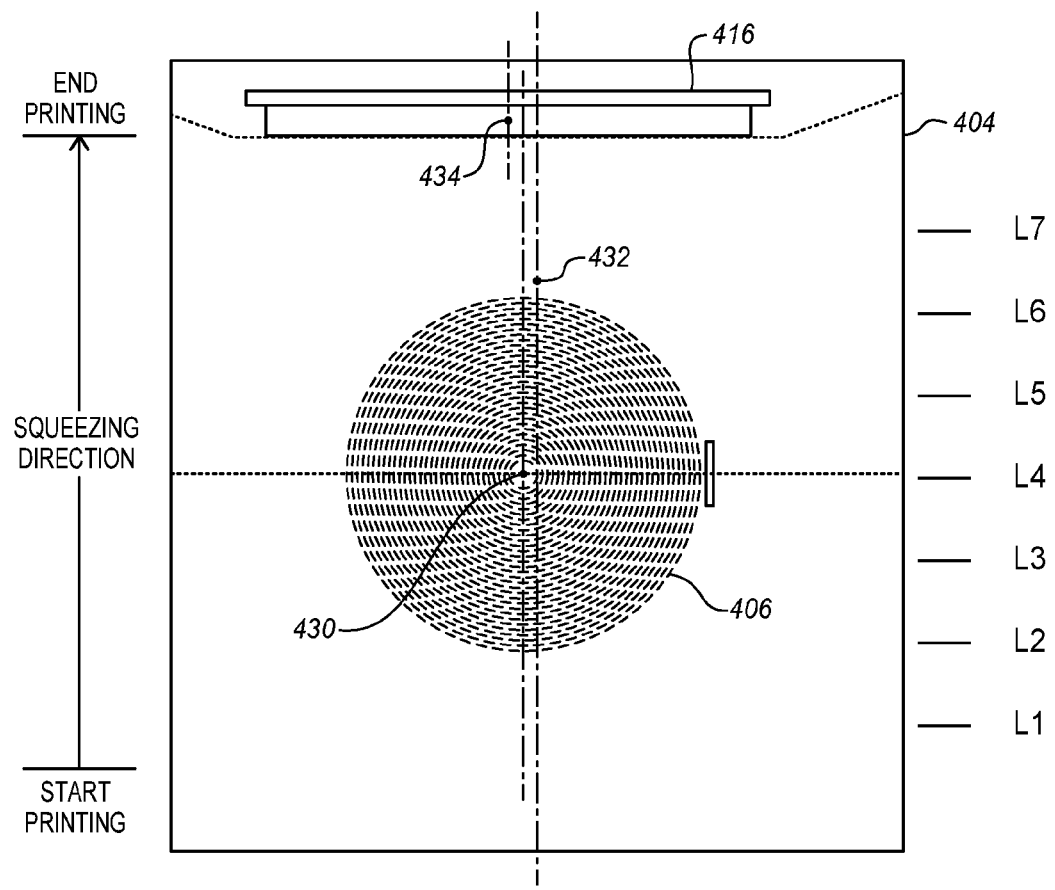
FIG. 9 is a top view diagram of a printer set-up for symmetric ink printing (SIP) with multiple squeegee positions according to an embodiment.

FIG. 9 is a top view diagram of the same printer bed 404 and squeegee 416. In this example, the heater traces center 430 may be aligned with the print screen's center line 432 and the squeegee's center 4345 but only at one point. Any misalignment will result in lines from the aligned center diverging. FIG. 9 also shows examples of 7 different positions (L1, . . . L7) along the path of the squeegee from start to end.

The printer squeegee's auto-zero feature may be used at each of these multiple locations along the squeegeeing direction to map out a conformal parallelism. The mapped data may then be programmed into a squeegee control software parameter set for conformal printing. The auto-zero at multiple locations (L1, . . . L7) may be mapped to the printer bed's un-flatness.

Figure 10:
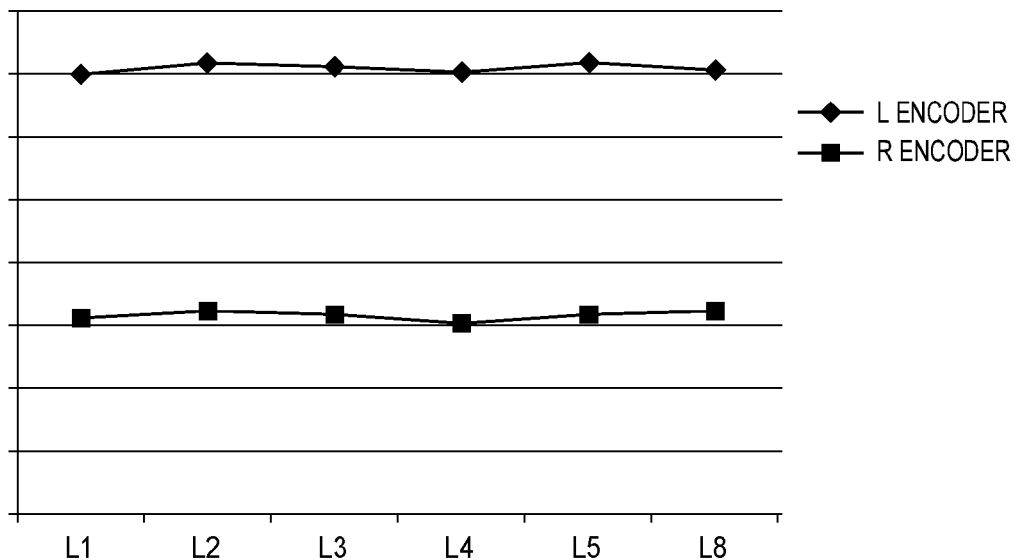
FIG. 10 is a graph of motor encoder values against each of eight different positions along the path of the squeegee according to an embodiment.

FIG. 10 is a graph showing measurements that might be used with the motor encoder. FIG. 10 is a graph of motor encoder values or steps on the vertical axis against each of eight different positions along the path of the squeegee. The printer squeegee's auto-zero feature is used at each of the eight multiple locations along the squeegeeing direction to obtain conformal parallelism over the heater trace pattern. There is a different value on the right rail from the left rail and so there are two set of data point for each squeegee position (L1 . . . L8).

A Compensation Method for Print Thickness Trending Based on SIP Printing Method

Using the principles discussed herein a method may be described that compensates for print thickness in SIP printing. Such a method uses:

1) a symmetric ink printing method which first identifies hidden printer hardware's skews for eliminating or minimizing those later hard-to-identify root causes for systematic print skew, and 2) a motorized actuator encoder to precisely control squeegee set up, namely gap and parallelism to the printer bed.

3) with this SIP printing method a knowledge-based model is then established with a lean DOE plan. Operators can use this simple and repeatable method for setting up squeegee easily without trial printing.

Printer bed un-flatness and squeezing rail un-parallelism along the squeezing direction are another major root cause of an inconsistent temperature contour in an ESC that is formed using printed green sheets or green bodies. An inconsistent temperature contour may affect chamber matching and CD (critical dimension) tuning as shown in FIG. 9. In this figure, seven locations along the squeezing direction are mapped on the printer bed, among which five locations cover heater traces of the screen mask pattern. The obtained set of motor encoder values is equivalent to a fingerprint of the conformal planar relationship during squeezing and that relationship can be programmed into a printer control system for conformal printing.

After the parameters or motor encoder steps are determined for a particular printer bed, screen, and ink are set, the ink thickness may still vary over time and with use. Printed ink thickness may be uniform across the print screen but the thickness can trend upward or downward over a large production lot.

Figure 11:
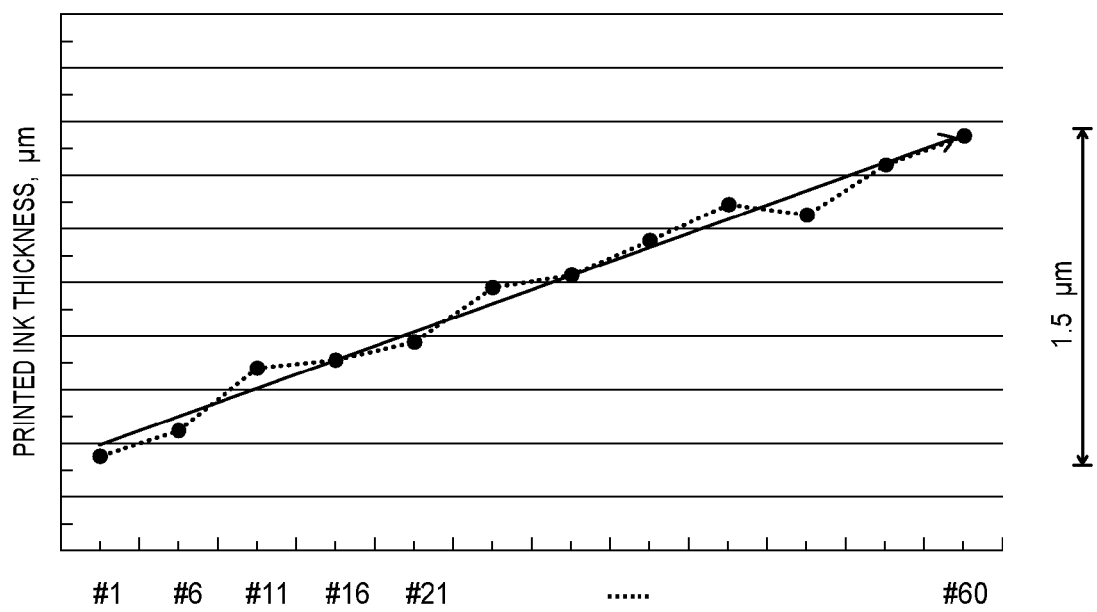
FIG. 11 is a graph of printed ink thickness against lot numbers according to an embodiment.

FIG. 11 is a graph of printed ink thickness on the vertical axis for lot numbers on the horizontal axis. There is an average ink thickness value for each lot and a line is drawn through the values to show the increasing trend. In this example, the ink thickness increases 1.5 µm through the printing of 60 ceramic green sheets from the first sheet to the last. This much change can be critical to some applications and, therefore, limits the lot size. Root causes for trending could be multiply complex and confounded. They may include: changing of ink viscosity during printing, changing of screen tension screen mask cleaning, screen mask lifting, etc. Regardless of these complex trending mechanisms, the trend may be compensated to flatten the trend.

Figure 12:
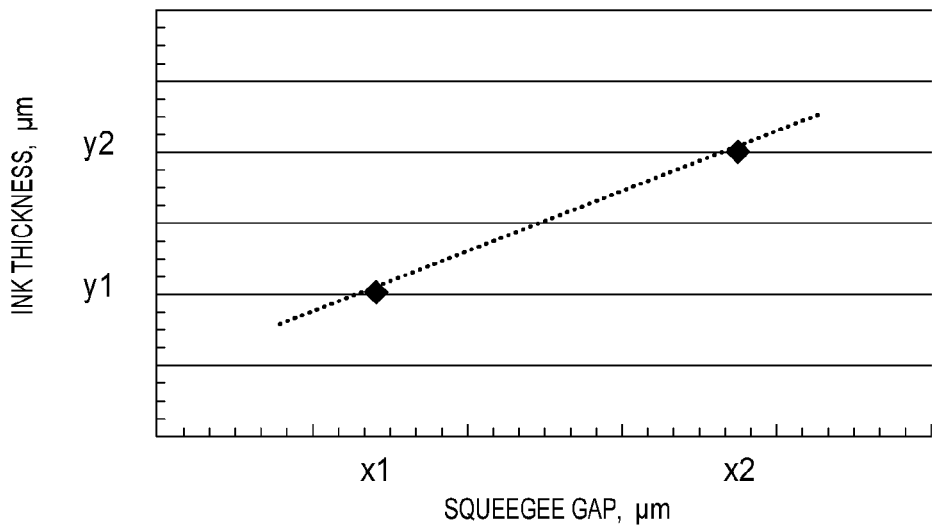
FIG. 12 is a graph of ink thickness against squeegee gap according to an embodiment.

It may be observed for many systems that there is a linear relationship between the squeegee gap or motor encoder position and the ink thickness. FIG. 12 is a graph of ink thickness on the vertical axis against the squeegee gap on the horizontal axis. There are two data points at two different gaps that produce two different thicknesses. If there were additional points then the same straight line could be drawn through all of them.

For any given screen mask design, a flattening method may be used that relies on the linear relationship between the squeegee gap/encoder and the ink thickness. In the example data shown in FIG. 11, the trending is estimated at a 1.5 µm thickness change over a printing of 60 green sheets. To improve the printing precision, this linear relationship may be measured with a simple DOE plan. A DOE as shown in FIG. 12 may set the squeegee at two gaps of (x1, x2) µm or equivalent motor encoder steps and then generates the corresponding paired ink thickness of (y1, y2) µm. A trending sensitivity may be calculated as a ratio of the ink thickness change of (y2−y1)=4 µm to the squeegee gap change of (x2−x1)=28 µm.

The printer squeegee gap setting is in a range of (x1, x2)µm, and the corresponding printed ink thickness is in a range of (y1, y2)µm. This relationship is important for calculating compensation for the printed ink thickness trending. The greater the spacing between x1 and x2 in the DOE planning the greater the precision and the robustness of the model, but the spacing should be narrow enough to remain in the linear region.

Motor encoder settings may be compensated by combining two pieces of the information above. The compensation may be derived as (28/4)×(1.5/60)=0.175 µm/sheet. An equivalent expression with the encoder is straightforward. For example, if an encoder unit is equivalent to 1 µm then a compensation scheme would be to change the encoder units for that one encoder for every 6th (i.e. 1/0.175) green sheet that is printed. The printed thickness variation after the compensation had been applied is then reduced to 0.15 µm, or 1/10 of the original trending range.

Figure 13:
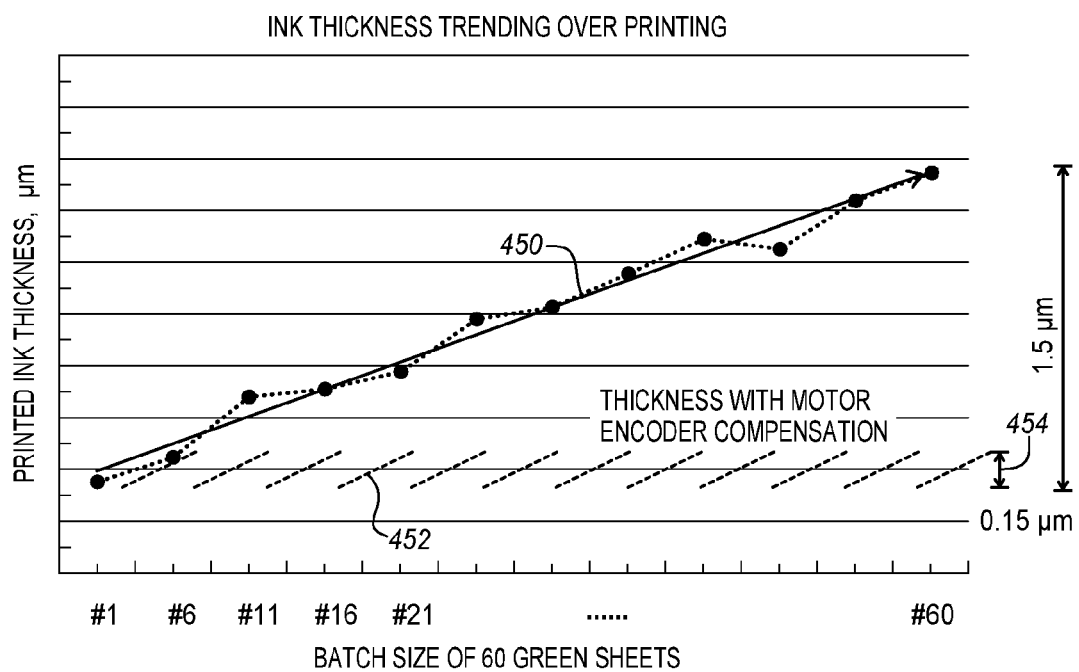
FIG. 13 is a graph of printed ink thickness against batch size of printed green sheets according to an embodiment.

Encoder compensation may be integrated with a conformal map (from a printer auto-zero feature). FIG. 13 illustrates calculated results with motor encoder compensation. FIG. 13 is a graph of printed ink thickness in the vertical against the batch size of printed green sheets on the horizontal. The upper linear increasing line 450 shows the increase in ink thickness if the ink thickness is not compensated. The lower line 452 shows the ink thickness and its variation 454 when the trend is compensated by adjusting the motor encoding.

In this example, the squeegee setting is in a range of (x1, x2)µm, and the corresponding ink thickness range is (y1, y2)µm. The approach to flattening this increasing trend is based on the relationship between ink thickness and the squeegee gap as described above. As a result, the reduction in screen printing performance is compensated by reducing the squeegee gap.

Once the ESC manufacturing has a repeatable temperature contour pattern, a comparison of a wafer temperature map allows information for improving the heater trace design or the cooling base design or both. Highly repeatable and uniform printing of metallization materials enables ESC design effectiveness and efficiency for an advanced electrostatic chucking apparatus.

Implementation of SIP Printing Method

The conformal relationship data between the squeegee and the printer bed may be programmed in the printer control software that coordinates the motor encoder's compensation of each squeegee end during squeezing. Optimization with motor encoder steps can be further attempted if temperature skew is consistent and persistent from ESC to ESC. A DOE may be planned to obtain the core data for determining compensation parameters. FIGS. 11 and 12 show some of the data that may be used to obtain results like those of FIG. 13.

The setup of both the screen mask and the squeegee is aligned with the heater trace center. The squeegee gap and its parallelism to the printer bed are optimized with the printer's auto-zero feature and recorded with motor encoders.

The printer bed flatness and un-parallelism of the squeegee rails both impact the consistency of the ink printing. Squeegee gaps (h1, h2, h3, h4) of FIG. 8 are not the same because the printer bed is not perfectly flat. Their measurement is not repeatable if squeegee mounting is not consistent.

The printer squeegee's auto-zero feature is used at multiple locations along squeezing direction to map out a conformal parallelism. The mapped data can be programmed into squeegee control software conformal printing.

Method of Screen Mask Design for a Precision Application Based on Symmetric Ink Printing Method A highly repeatable squeegee set up procedure for a symmetric ink printing (SIP) method with sub-micron uniformity of metallization materials on green sheet ceramic is described. How to use motor encoders of squeegee motorized actuators, linear or rotary, to map out a non-flat printer bed for a conformal parallelism at precision of a motor encoder is also described. How to flatten a uniform ink printing but with a linear trending of print thickness is also described. Implementation of all these methods with printer control software is also discussed.

An application of an SIP printing method for an optimal screen mask design for a precision ink printing is described here. Printing with precision thickness does require some design iteration. An iteration can be effective if print skew is minimized with the SIP printing method. It is useful to shorten the product development cycle that involves a series of lengthy and complicated ceramic sintering processes and post sintering processes.

Screen mask design involves screen wire selection and a screen "height" parameter X. The value of X is correlated to the realized ink thickness. Wire selection is empirically straightforward, but design parameter X needs numerous iterations for critical applications. A lean process for optimizing design parameter X for a given wire diameter is described.

A new screen mask design starts with an empirical equation developed by a mask designer. Empirical models have only first order accuracy. The screen mask design activity may be divided into two processes: The first process focuses on establishing a robust model between squeegee gap and printed ink thickness, and the second process focuses on establishing a correlation between printed ink thickness and heater resistivity. This approach intends to minimize the need for frequent sintering. All trial printing green sheet ceramics are sintering in the same lot.

Process 1:

A purpose of this process is to establish a quality correlation with a least error between the squeegee gap and the printed ink thickness with the SIP printing method. This is achieved by a wide spacing between x−, xo and x+. The spacing is as wide as possible but remains in the linear region.

Figures 14, 15:
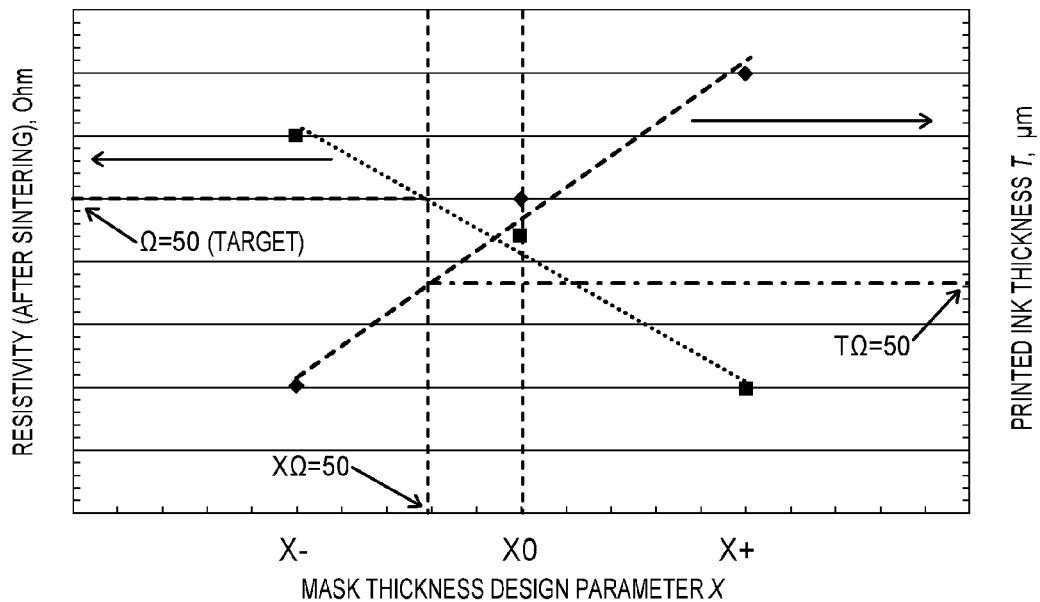
FIG. 14 is a graph of printed ink thickness or printed ink resistivity against a mask thickness design parameter identified as X according to an embodiment.
FIG. 15 is a table of data collected when designing a print screen and squeegee gap configuration according to an embodiment.

FIG. 14 is a graph of printed ink thickness or printed ink resistivity in the vertical against a mask thickness design parameter identified as X in the horizontal. Since ink thickness and resistivity have a linear relationship for any one ink type and processing method, these may be plotted on the same vertical axis.

To use the FIG. 14 chart, the designer sets X=x0 as shown on the horizontal axis and inputs it into a design equation that is only of first order accuracy. t0 is the output ink thickness with the design equation. The design may be validated after completing a sintering process.

To speed up mask design, and also to obtain a quality model, two additional screen masks with input design parameter x− and x+, respectively, shown also on the horizontal axis, are made such that the predicted t− and t+ are about 20%-25% less than t0 and 20%-25% higher than t0, respectively. It is simply a DOE plan for a correlation with better signal-to-noise ratio.

Following an SIP printing method, that is intended to print highly uniform and repeatable ink thickness on green sheet ceramic, a few trial green sheet ceramic with masks A, B and C are printed. Note that manufacturing lead time for three masks is much shorter than the lead time for sintering and other processes. With these output data, a quality correlation model can be established between mask design parameter X and printed ink T or resistivity, and the results are plotted in FIG. 14.

In FIG. 14, it is assumed that XΩ=50 is the desired value for the screen mask design parameter X that would allow the printer to print TΩ=50, and that leads to a target heater trace resistivity Ω=50 per ESC design. In the example there is a gap on the horizontal axis between XΩ=50 and X0. An encoder DOE may be implemented to close this gap using the squeegee gap adjustment or another parameter.

Three mask designs, referenced as A, B, C in FIG. 15, represent three levels of parameter X at the level of X+, X0, and X−, respectively. The associated printed ink thickness is denoted as t+, t0, t−, respectively, and resistivity after sintering as Ω+, Ω0, Ω−, respectively. In this example, Mask B represents the intended design, and both Mask A and C are used to develop a robust correlation between mask design parameters to printed ink thickness and heater trace resistivity.

FIG. 15 is a table to show an example of the types of data that may be collected when designing a screen for a particular printer configuration. A multi-level encoder DOE based on a squeegee gap g0 is planned, as indicated by the squeegee gap column. An encoder DOE for mask design B is used in this example to develop a compensation method for mask design B.

A five level squeegee gap (g0 . . . g4) is set up to determine a correlation between the squeegee encoder and the printed ink thickness. Trial prints at each encoder setting may be a minimum of 2 to estimate the error term. Trial printing with masks A, B, and C may be of a minimum of 3.

Squeegee set up g0 is a prior set up that mask engineers would use or a DOE would be needed for determining it. The squeegee gap g0 may be based on prior experience from mask design engineers or printer manufacturers can recommend as a value by experience. In this example, a five level encoder DOE, as indicated in the encoder DOE column, may be used if the sintering batch is big enough to accommodate all trial green sheets in the same sintering process. If not, some levels, e.g. levels g1 and g3, may be skipped. Information for g2 and g4 may be sufficient to set the constructive. In this example, the encoder levels or values are set as follows (however any other levels may be used):

g1 encoder is set 10% more than g0
g2 encoder is set 20% more than g0
g3 encoder is set 10% less than g0
g4 encoder is set 20% less than g0

In this example there are three trial printings, as indicate in the minimum trial printings column, with each mask design and two trial printings with mask B at each encode level. Therefore, a total of 17 green sheets are printed in Process A for five level encoder DOE or 13 green sheets are printed for 3 level encoder DOE in case of a limited sintering capacity. The same may be repeated for Mask A and Mask B.

Process 2:

Review printing and sintering result.

If the results produced with mask design B with encoder DOE can meet the ESC design spec then the screen mask design is completed with one sintering process.

If the results produced with mask design B in Process A does not meet the design requirement or there are desires to further optimize the mask design, the quality correlation from 3 mask designs may be used to point out the desired mask design parameter resistivity to provide e.g. XΩ=50 is and output resistivity to be Ω=50 with reasonable error. In a second design iteration, an encoder DOE can be planned or ignored since the encoder steps compensation power is already estimated in Process A.

Among the challenges of traditional approaches of screen mask design for critical applications is the numerous design iterations used to achieve a design target. Ink printing quality and consistency are inadequate due to the lack of optimization of the printing technology. SIP precision and uniform printing capability break up tail-chasing patterns and allow an efficient design process with sufficient knowledge to be developed in a cost effective manner.

The techniques described above may be represented as a sequence of operations. Four different and related processes have been described indicated below as Methods A, B, C, and D.

Figure 16:
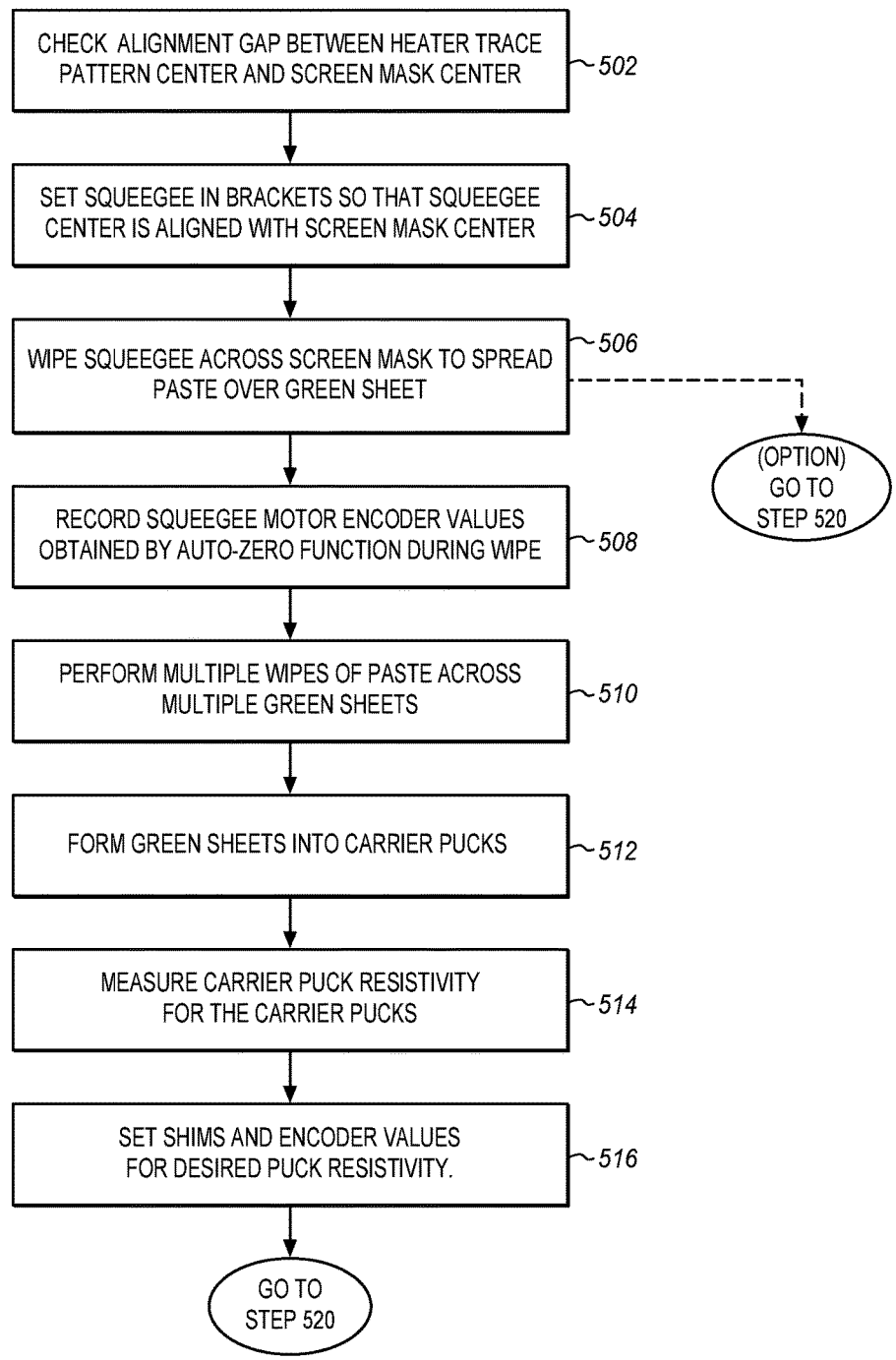
FIG. 16 is a process flow diagram of a method for highly repeatable squeegee set up according to an embodiment.

Method A:

FIG. 16 is a process flow diagram of a method for highly repeatable squeegee set up using the precision of a motorized encoder.

1) Start at 502 with a screen mask that is manufactured based on a screen mask design for a target print ink thickness for an ESC application. Measure the alignment gap between the heater trace pattern center to the screen mask center. Compare the gap to some tolerance. If the screen mask gap meets the tolerance then go to the next operation.

2) Design at 504 a set of two squeegee mounting brackets to tightly mount a squeegee to a printer squeegee holder. The squeegee mounting brackets are designed such that the center of a mounted squeegee is aligned with the center of the screen mask with some tolerance. Modify the squeegee holder for using squeegee brackets if a hardware change is necessary.

3) Check the printer control system for its auto-zero capability. Auto-zero is a feature that a printer control system uses for equalizing some transducer signals, such as pressure or other signals, when both squeegee ends, left or right, reach a conformal contact to a printer bed. During squeegee wipes of paste over the screen at 506, the printer control system can record the motor encoder values at 508 in its memory when the auto-zero function is executed and display the encoder steps on control interface. If auto-zero capability is not available, equip the printer with this capability.

4) Validate at 510 the repeatability of the squeegee mounting at the location of the heater trace pattern center with the printer auto-zero feature. The encoder readings from the control interface are analyzed for repeatability. Perform statistical analysis on the encoder data including the average and variance. These statistic attributes in terms of the encoder depend on the transducer resolution or sensitivity. Select an appropriate transducer per application requirement. The encoder values may be compared to the resulting pucks. The repeated printed green sheets may be formed into carrier pucks at 512 and the printed electrical traces may be tested for resistivity at 514.

5) The difference between the encoder values averaged between squeegee left and right ends represents the un-parallelism of the squeegee to the printer bed, or slant skew. This difference is characteristic for the squeegee being used and the associated mounting brackets. The encoder information and the shims may be used to configure the screen printer for the next batch at 516. The encoder information with use of the auto-zero feature represents the printer hardware capability limit for the highest possible repeatable squeegee set-up.

Traditional squeegee set-up methods use shimming devices to set up a squeegee gap in a time-consuming way. This method is operated using subjective judgment without knowing the squeegee gap, the degree of parallelism, and so on. Repeatability is poor and difficult to apply to adjustments for sub-micron uniformity applications. Beside the poor repeatability, trial printing with green sheet ceramic is done for every production lot. This traditional method is fundamentally inefficient and ineffective.

The SIP printing method, using a repeatable squeegee set up and encoder information in the printer control system, lays down an architecture for a conformal and precise printing with sub-micron uniformity for critical applications. Once a printing recipe is established, any trained operator can repeat the same encoder setting for a new production job. No shimming method or trial printing is needed.

Figure 17:
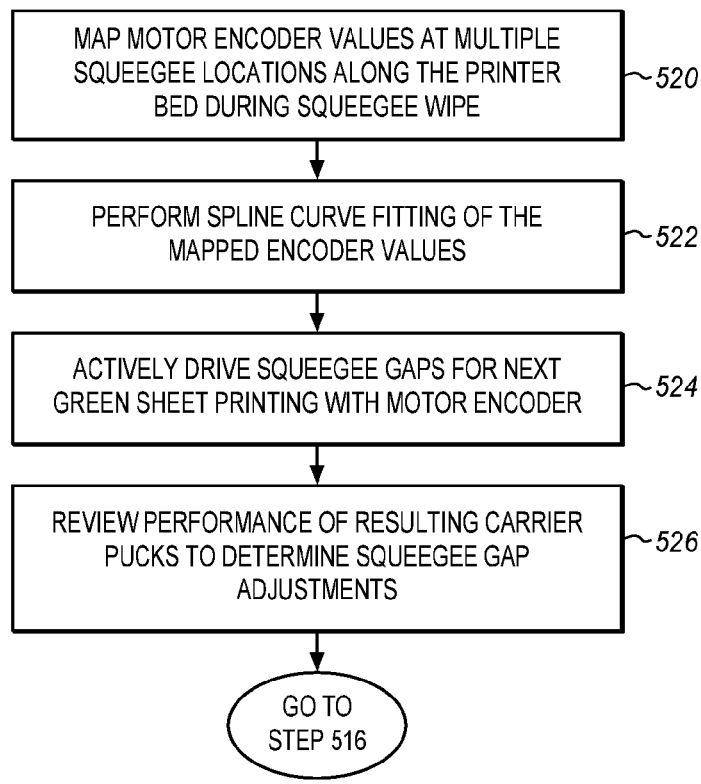
FIG. 17 is a process flow diagram of a method for conformal precision screen printing according to an embodiment.

Method B:

FIG. 17 is a process flow diagram of a method for conformal precision screen printing with sub-micron uniformity over screen mask with Symmetric Ink Printing (SIP).

A printer bed for screen printing is not perfectly made. Any printer bed has its own unique flatness variations measured in Ra and any one printer bed differs from other printer beds. In the same way, any motorized squeegee motion is unique and differs for each printer. These variations combined can cause print skew that is hard to recognize for screen printing. There is no known method or technology currently available in screen printing industries to address these variations.

Conformal screen printing technology is defined as a printing method that exerts a uniform squeegeeing pressure along the full squeegee length of the printer bed during printing. A type of conformal screen printing technology for large green sheet ceramic is described below. This conformal printing is further developed based on the SIP method described Method A above.

6) Map at 520 the printer bed at multiple locations along the squeegeeing direction. Equal spacing is used. The obtained encoder data is a characteristic for a given printer system and the squeegee being used including the squeegee mounting brackets. The number of mapping locations are selected to allow an adequate spline curve-fitting.

7) Perform statistical spline curve fitting at 522 with the above mapped data, one spline curve for each squeegee end, so two splines are obtained. These spline curves are expressed in terms of the encoder and represent smoothed squeegee gap compensation by the motorized actuator that controls the squeegee gaps.

8) Store spline data in the control system memory. The printer control system uses these profiles in its algorithm to actively drive squeegee gaps at 524 in the printing direction with smoothed conformal squeegee pressure.

9) Review the ESC temperature performance and decide if another design iteration for the heater trace pattern is necessary at 526. At this stage in the process, the resulting ESC will present repeatable temperature maps with little manufacturing variation. Temperature non-uniformity may exist but at this stage further improvement is obtainable by design compensation for the design cycle efficiency. The settings may be used to configure the printer for the next set of green sheets at 516

Figure 18:
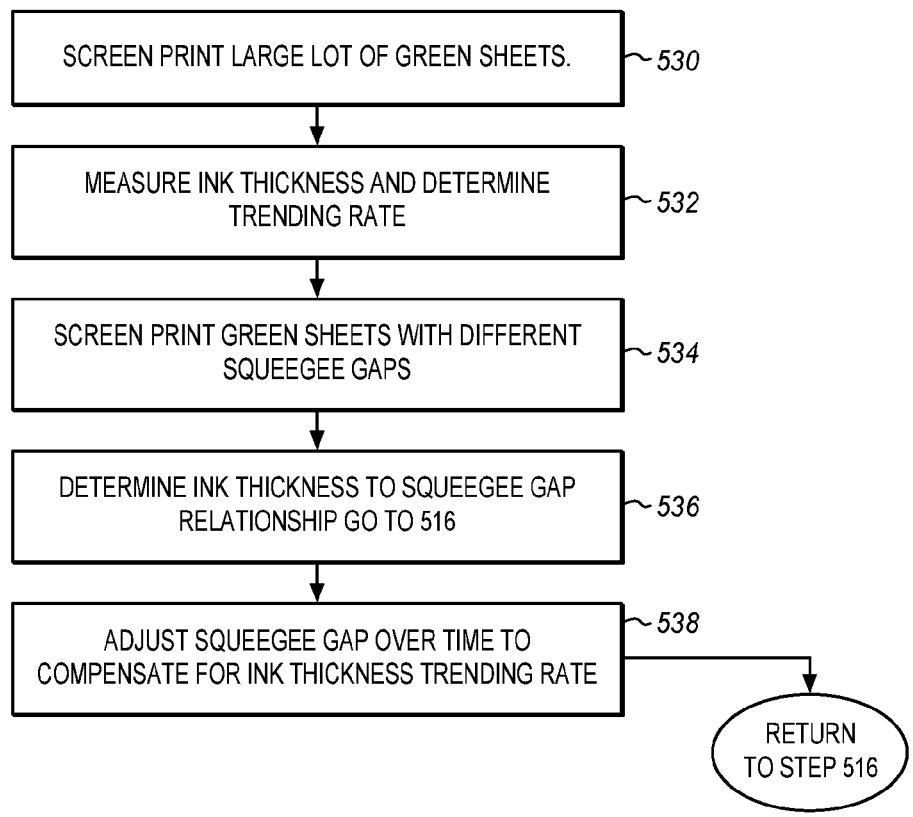
FIG. 18 is a process flow diagram of a method of compensation for ink thickness trending according to an embodiment.

Method C:

FIG. 18 is a process flow diagram of a method of compensation for ink thickness trending over a large print batch suitable for use with Symmetric Ink Printing (SIP).

Printing with sub-micron uniformity may be achieved with the SIP method in a methodical approach. However, print trending often occurs when printing a large lot. Print trending is a combined effect of multiple complex and interactive mechanisms between ink viscosity, screen wire tension, screen mesh cleanliness and so on. This may be addressed as described below.

10) Screen print at 530 a large lot, e.g. 60 green sheets, with the SIP method described above.

11) Measure the print ink thickness trending rate at 532. This rate may be measured as a ratio of thickness change to the total number of green sheets. For example, a print thickness change of 1.5 μm is found associated with a printing lot of 60 ceramic green sheets.

12) Plan a two-level DOE with a wide spacing of the squeegee gap in terms of the encoder at 534. This spacing is wide enough to robustly determine the print thickness rate at two levels. As a guideline, the thickness difference for this DOE is about ±20%-30% of the target thickness. This DOE establishes a translation that is useful for trending compensation by performing multiple printings of green sheets with two or more additional squeegee gaps.

13) Combine results from both 11 and 12 to determine the trending rate per sheet printing at 536. Ink thickness trending rate is an indication of the ink thickness at different squeegee gaps. This relationship may be translated from μm/sheet to the equivalent encoder count or value/sheet.

14) Method for trend flattening is based on equivalent encoder trending rate per consecutive sheet. The encoder value is adjusted at 538 as the sheets are printed to compensate for the increase in thickness of the ink as subsequent sheets are printed. If this rate is greater than 1.0 encoder step then encode adjustment for compensation is at the resolution of a single encoder step. For example, if this rate is 2.5 encoder steps per sheet then a first adjustment of 2 encoder steps for one sheet and a next adjustment of 3 encoder steps for next sheet printing may be done. If the rate is a fraction of the encoder steps then the reciprocal of the fraction is the desired adjustment. For example, if an equivalent trending rate is determined to be 0.25 encoder steps/sheet then an adjustment of one encoder steps for every four (1/0.25) consecutive printing may be made. The trending compensation method may be implemented in software. A manual adjustment is also possible. A software algorithm can be developed to integrate all of the features herein.

Figure 19:
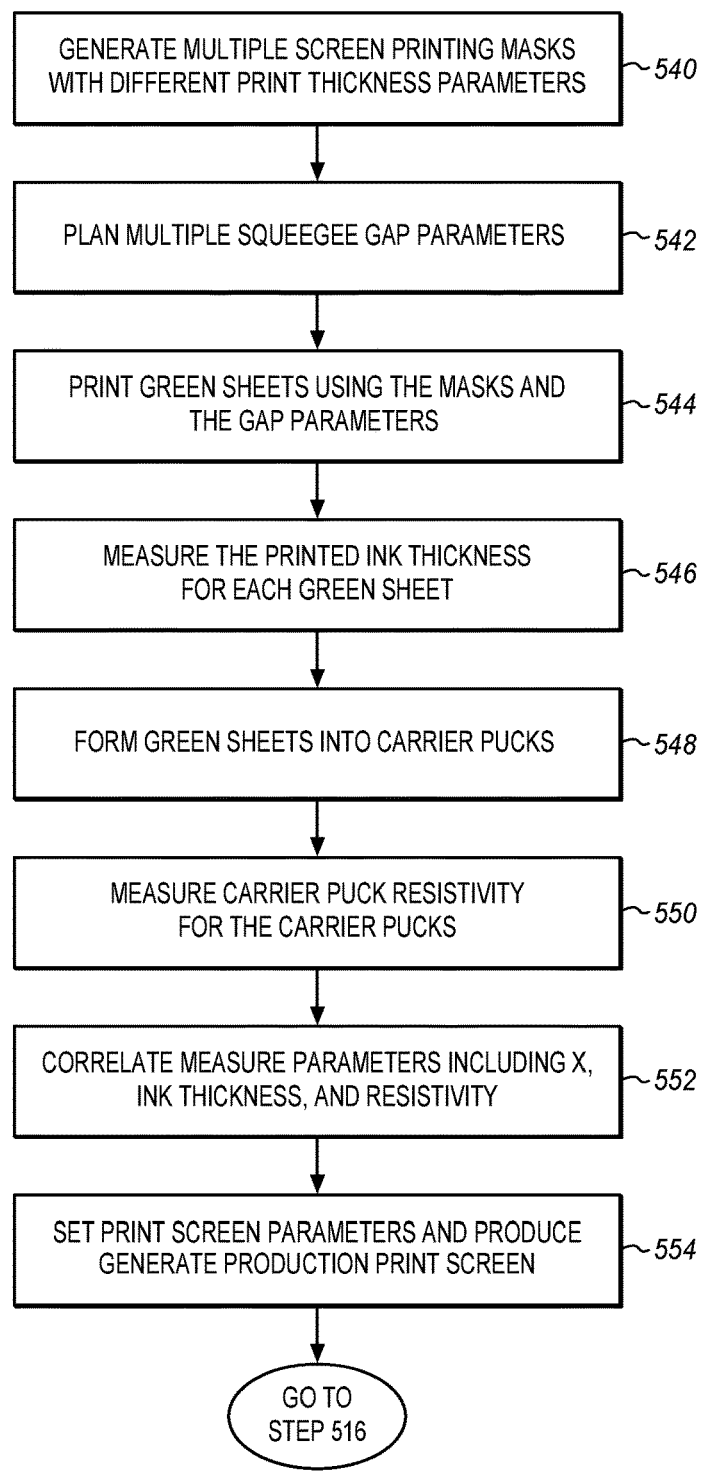
FIG. 19 is a process flow diagram of a method for screen mask design according to an embodiment.

Method D:

FIG. 19 is a process flow diagram of a method for screen mask design suitable for precision application with SIP printing.

Screen mask design typically involves two design parameters, one parameter is the wire diameter and the other is a thickness related design parameter, called X here.

1) Generate at 540 multiple screen printing masks with different print thickness parameters. These may then be used to perform tests to optimize the X value and the squeegee gap. In one example, three screen masks are made with three different X values. These masks are designated as Mask A, Mask B and Mask C. Note that the same mesh wire and the same heater trace pattern are used in these masks, only the X parameter has different values. These values are estimated using a formula that may be theoretically or empirically derived. The formula provides first order accuracy. In a particular example, Mask B has X at X0, i.e. X=X0. Mask A has X=X−, and Mask C has X=X+. Take a ratio as follows: X−/X0=~80% and X0/X=~80%. Make all the masks available at the same printing job described in Step 3. Mask B is a candidate mask for the target design.

2) Plan at 542 a DOE for squeegee set up. Squeegee set up may be based on a parameter g0 that is empirically determined or used as a starting estimate. A typical range may be from 50 μm to 200 μm for precision screen printing. A five level DOE for determining encoder compensation is created. This DOE is called Encode DOE. An example is shown in FIG. 15.

3) A total of 17 green sheets for example are printed at 544 with the SIP method described above. In the described example, there are 3 trial prints with the use of Mask A, 3 trial prints with the use of Mask C, and 3 trial prints with the use of B, and all these trial print have the same squeegee setting at g0. The encoder DOE only uses Mask B and in this DOE prints 2 trial prints with squeegee levels at the other gap levels as shown in FIG. 15. 8 trial prints are printed in the same print job. Any other number of levels or numbers of duplicate prints may be made depending on the printer and its parameters.

4) Measure at 546 the printed ink thickness with a reliable method, either contact or non-contact methods.

5) Convert at 548 the 17 green sheets into 17 green ESC pucks, one puck for each printed sheet.

6) All 17 pucks are sintered in the same sintering job. If the sintering furnace capacity is less than 17 green pucks then the g1 and g3 in the Encode DOE can be skipped. The same furnace and the same job are used to eliminate variations in sintering that may affect the measurements.

7) Measure at 550 the individual resistivity of each puck after sintering and any other fabrication processes required to complete each puck, such as brazing.

8) Construct at 552 a plot as shown in FIG. 14. All correlation between the design parameter X, the ink thickness T, and the resistivity Ω are all plotted. These plots are called a knowledge-base for the screen mask design with SIP method. The results may be used to determine parameters for a production print screen at 554 and then an appropriate production screen is used with the determined printer parameters and configuration at 516.

9) If the design error is excessive, then design iteration may be used. The choice for the X value for the next iteration may be selected decided with the model or in another way. If the design error is minor then the built-in encoder DOE can bridge the design error with the encoder compensation. With this approach, screen mask design can be completed with one sintering job or at most with two. Screen mask development time and cost for precision applications are greatly reduced.

Figure 20:
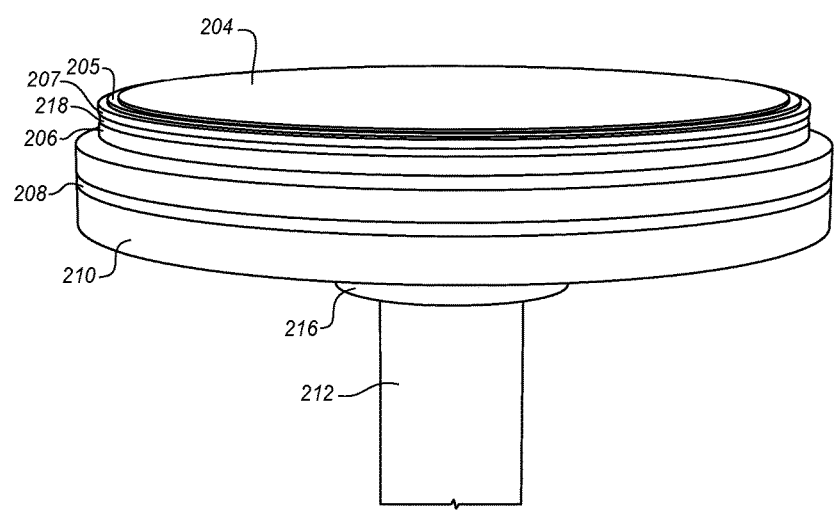
FIG. 20 is an isometric view of an assembled electrostatic chuck suitable for use according to an embodiment.

FIG. 20 is an isometric view of an assembled electrostatic chuck. A support shaft 212 supports a base plate 210 through an isolator 216. A middle isolator plate 208 and an upper cooling plate 206 are carried by the base plate. The top cooling plate 206 carries a dielectric puck 205 on the top surface of the upper cooling plate. The puck has an upper circular platform 205 to support a workpiece 204 and a lower concentric circular base 207 to attach to the cooling plate 206. The upper platform has internal electrodes to electrostatically attach the workpiece. The workpiece may alternately be clamped, vacuumed or attached in another way. There is an adhesive bond 218 between the puck 215 and the top cooling plate 206 to hold the ceramic of the top plate to the metal of the cooling plate. As described herein, heaters, electrodes, or both may be formed in the puck using a printing process on green sheets. The middle plate may perform cooling, gas flow, and other functions, depending on the particular implementation.

The ESC is able to control the temperature of the workpiece using resistive heaters in the puck, coolant fluid in the cooling plate, or both. Electrical power, coolant, gases, etc. are supplied to the coolant plate 206 and the puck 205 through the support shaft. The ESC may also be manipulated and held in place using the support shaft.

Figure 21:
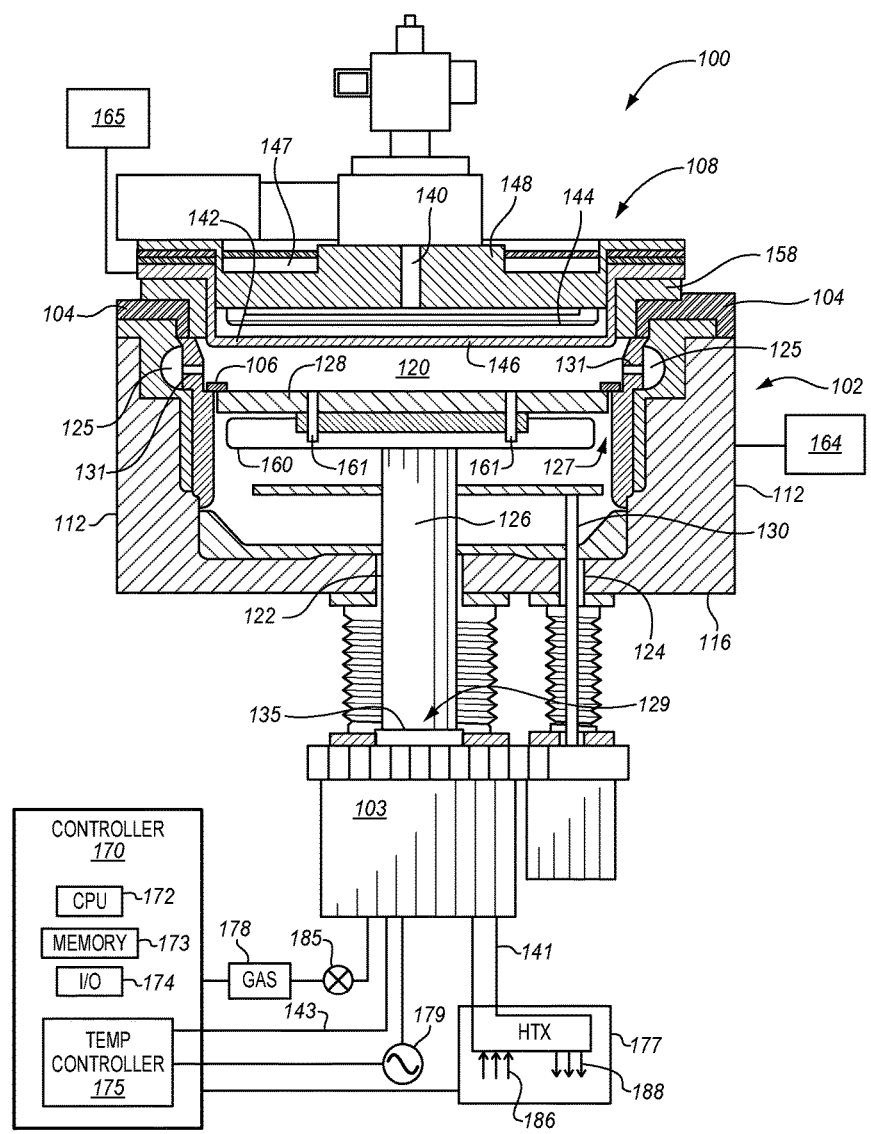
FIG. 21 is a schematic of a plasma etch system including a pedestal assembly suitable for use in according to an embodiment.

FIG. 21 is a partial cross sectional view of a plasma system 100 having a pedestal 128 according to embodiments described herein. While a pedestal is shown here, the principles described herein may be used on any of a variety of different workpiece carriers including different types of chuck, carriers, and pedestals. While a chamber pedestal is shown, the described principles may also be applied to workpiece carriers that are used outside of processing chambers. The pedestal 128 has an active cooling system which allows for active control of the temperature of a substrate positioned on the pedestal over a wide temperature range while the substrate is subjected to numerous process and chamber conditions. The plasma system 100 includes a processing chamber body 102 having sidewalls 112 and a bottom wall 116 defining a processing region 120.

A pedestal, carrier, chuck or ESC 128 is disposed in the processing region 120 through a passage 122 formed in the bottom wall 116 in the system 100. The pedestal 128 is adapted to support a substrate (not shown) on its upper surface. The substrate may be any of a variety of different workpieces for the processing applied by the chamber 100 made of any of a variety of different materials. The pedestal 128 may optionally include heating elements (not shown), for example resistive elements, to heat and control the substrate temperature at a desired process temperature. Alternatively, the pedestal 128 may be heated by a remote heating element, such as a lamp assembly.

The pedestal 128 is coupled by a shaft 126 to a power outlet or power box 103, which may include a drive system that controls the elevation and movement of the pedestal 128 within the processing region 120. The shaft 126 also contains electrical power interfaces to provide electrical power to the pedestal 128. The power box 103 also includes interfaces for electrical power and temperature indicators, such as a thermocouple interface. The shaft 126 also includes a base assembly 129 adapted to detachably couple to the power box 103. A circumferential ring 135 is shown above the power box 103. In one embodiment, the circumferential ring 135 is a shoulder adapted as a mechanical stop or land configured to provide a mechanical interface between the base assembly 129 and the upper surface of the power box 103.

A rod 130 is disposed through a passage 124 formed in the bottom wall 116 and is used to activate substrate lift pins 161 disposed through the pedestal 128. The substrate lift pins 161 lift the workpiece off the pedestal top surface to allow the workpiece to be removed and taken in and out of the chamber, typically using a robot (not shown) through a substrate transfer port 160.

A chamber lid 104 is coupled to a top portion of the chamber body 102. The lid 104 accommodates one or more gas distribution systems 108 coupled thereto. The gas distribution system 108 includes a gas inlet passage 140 which delivers reactant and cleaning gases through a showerhead assembly 142 into the processing region 120. The showerhead assembly 142 includes an annular base plate 148 having a blocker plate 144 disposed intermediate to a faceplate 146.

A radio frequency (RF) source 165 is coupled to the showerhead assembly 142. The RF source 165 powers the showerhead assembly 142 to facilitate generation of plasma between the faceplate 146 of the showerhead assembly 142 and the heated pedestal 128. In one embodiment, the RF source 165 may be a high frequency radio frequency (HFRF) power source, such as a 13.56 MHz RF generator. In another embodiment, RF source 165 may include a HFRF power source and a low frequency radio frequency (LFRF) power source, such as a 300 kHz RF generator. Alternatively, the RF source may be coupled to other portions of the processing chamber body 102, such as the pedestal 128, to facilitate plasma generation. A dielectric isolator 158 is disposed between the lid 104 and showerhead assembly 142 to prevent conducting RF power to the lid 104. A shadow ring 106 may be disposed on the periphery of the pedestal 128 that engages the substrate at a desired elevation of the pedestal 128.

Optionally, a cooling channel 147 is formed in the annular base plate 148 of the gas distribution system 108 to cool the annular base plate 148 during operation. A heat transfer fluid, such as water, ethylene glycol, a gas, or the like, may be circulated through the cooling channel 147 such that the base plate 148 is maintained at a predefined temperature.

A chamber liner assembly 127 is disposed within the processing region 120 in very close proximity to the sidewalls 112 of the chamber body 102 to prevent exposure of the sidewalls 112 to the processing environment within the processing region 120. The liner assembly 127 includes a circumferential pumping cavity 125 that is coupled to a pumping system 164 configured to exhaust gases and byproducts from the processing region 120 and control the pressure within the processing region 120. A plurality of exhaust ports 131 may be formed on the chamber liner assembly 127. The exhaust ports 131 are configured to allow the flow of gases from the processing region 120 to the circumferential pumping cavity 125 in a manner that promotes processing within the system 100.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The system controller 170 also includes a central processing unit 172, memory 173 and input/output interface 174. The temperature controller receives a temperature reading 143 from a sensor (not shown) on the pedestal. The temperature sensor may be proximate a coolant channel, proximate the wafer, or placed in the dielectric material of the pedestal. The temperature controller 175 uses the sensed temperature or temperatures to output control signals affecting the rate of heat transfer between the pedestal assembly 142 and a heat source and/or heat sink external to the plasma chamber 105, such as a heat exchanger 177.

The system may also include a controlled heat transfer fluid loop 141 with flow controlled based on the temperature feedback loop. In the example embodiment, the temperature controller 175 is coupled to a heat exchanger (HTX)/chiller 177. Heat transfer fluid flows through a valve (not shown) at a rate controlled by the valve through the heat transfer fluid loop 141. The valve may be incorporate into the heat exchanger or into a pump inside or outside of the heat exchanger to control the flow rate of the thermal fluid. The heat transfer fluid flows through conduits in the pedestal assembly 142 and then returns to the HTX 177. The temperature of the heat transfer fluid is increased or decreased by the HTX and then the fluid is returned through the loop back to the pedestal assembly.

The HTX includes a heater 186 to heat the heat transfer fluid and thereby heat the substrate. The heater may be formed using resistive coils around a pipe within the heat exchanger or with a heat exchanger in which a heated fluid conducts heat through an exchanger to a conduit containing the thermal fluid. The HTX also includes a cooler 188 which draws heat from the thermal fluid. This may be done using a radiator to dump heat into the ambient air or into a coolant fluid or in any of a variety of other ways. The heater and the cooler may be combined so that a temperature controlled fluid is first heated or cooled and then the heat of the control fluid is exchanged with that of the thermal fluid in the heat transfer fluid loop.

The valve (or other flow control devices) between the HTX 177 and fluid conduits in the pedestal assembly 142 may be controlled by the temperature controller 175 to control a rate of flow of the heat transfer fluid to the fluid loop. The temperature controller 175, the temperature sensor, and the valve may be combined in order to simplify construction and operation. In embodiments, the heat exchanger senses the temperature of the heat transfer fluid after it returns from the fluid conduit and either heats or cools the heat transfer fluid based on the temperature of the fluid and the desired temperature for the operational state of the chamber 102.

Electric heaters (not shown) may also be used in the ESC to apply heat to the workpiece assembly. The electric heaters, typically in the form of resistive elements are coupled to a power supply 179 that is controlled by the temperature control system 175 to energize the heater elements to obtain a desired temperature.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluid such as those containing perfluorinated inert polyethers. While the present description describes the pedestal in the context of a PECVD processing chamber, the pedestal described herein may be used in a variety of different chambers and for a variety of different processes.

A backside gas source 178 such as a pressurized gas supply or a pump and gas reservoir are coupled to the pedestal assembly 142 through a mass flow meter 185 or other type of valve. The backside gas may be helium, argon, or any gas that provides heat convection between the wafer and the puck without affecting the processes of the chamber. The gas source pumps gas through a gas outlet of the pedestal assembly described in more detail below to the back side of the wafer under the control of the system controller 170 to which the system is connected.

The processing system 100 may also include other systems, not specifically shown in FIG. 21, such as plasma sources, vacuum pump systems, access doors, micromachining, laser systems, and automated handling systems, inter alia. The illustrated chamber is provided as an example and any of a variety of other chambers may be used with the present invention, depending on the nature of the workpiece and desired processes. The described pedestal and thermal fluid control system may be adapted for use with different physical chambers and processes.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of forming a puck of a workpiece carrier with electrical traces comprising:

screen printing a paste that contains metal on a first ceramic green sheet in a pattern of electrical traces, further comprising applying a squeegee of a screen printer to the first ceramic green sheet in a squeegeeing direction while the first ceramic green sheet is on a printer bed of the screen printer;

mapping the printer bed at multiple locations along the squeegeeing direction;

applying a statistical spline curve to the printer bed mapping for a left and a right side of the squeegee;

identifying non-uniformities in the printer bed mapping;

using the spline curve to actively drive squeegee gaps in the printing direction with smoothed conformal squeegee pressure;

screen printing the paste on additional ceramic green sheets using the actively driven squeegee gaps;

forming the first ceramic green sheet and the additional ceramic green sheets into carrier pucks;

measuring a resistance of the carrier pucks; and modifying a printer controller of the screen printer to compensate for mapped non-uniformities in the printer bed by adjusting the squeegee gap based on the measured resistance; and using the modified printer controller of the screen printer, screen printing a paste that contains metal on a second ceramic green sheet in the pattern of electrical traces; and processing the printed second ceramic green sheet to form the puck of the workpiece carrier.

2. The method of claim 1, further comprising drying the paste and wherein processing the printed second ceramic green sheet comprises compacting the printed second ceramic green sheet with a plurality of green sheets to form the puck.

3. The method of claim 2, wherein processing further comprises sintering the compacted second ceramic green sheet and plurality of green sheets and polishing the sintered second ceramic green sheet and plurality of green sheets.

4. The method of claim 1, the method further comprising:
using an auto-zero feature of the screen printer to record motor encoder values in a memory when printing; and
adjusting the squeegee mounting of the printer to compensate for variations as detected by the auto-zero feature.

5. The method of claim 1, wherein screen printing the paste on additional ceramic green sheets comprises printing with multiple print screens and wherein measuring the resistance comprises measuring the resistance corresponding to the multiple print screens, the method further comprising generating a print screen with parameters selected based on the measured resistance.

6. A method of forming a puck of a workpiece carrier comprising:
generating a screen mask for use with a screen printer;
trial screen printing metallization materials onto a plurality of ceramic green sheets with different screen masks with different squeegee settings of a screen printer to form trial green sheets;
converting the trial green sheets into pucks;
measuring the resistivity of the pucks;
correlating the resistivity to the different screen masks; and
generating a screen mask for use with the screen printer based on the correlation;
screen printing the metallization materials on a first ceramic green sheet using the screen mask that is based on the correlation; and
processing the printed ceramic green sheet to form the puck of the workpiece carrier.

7. The method of claim 6, wherein correlating the resistivity comprises correlating the resistivity to a print thickness parameter of each different screen mask.

* * * * *